(12) United States Patent
Sun et al.

(10) Patent No.: US 11,839,055 B2
(45) Date of Patent: *Dec. 5, 2023

(54) HEAT-CONDUCTING ASSEMBLY AND TERMINAL

(71) Applicant: Huawei Technologies Co., Ltd., Shenzhen (CN)

(72) Inventors: Yongfu Sun, Shenzhen (CN); Guo Yang, Dongguan (CN); Quanming Li, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/683,698

(22) Filed: Mar. 1, 2022

(65) Prior Publication Data

US 2022/0256739 A1 Aug. 11, 2022

Related U.S. Application Data

(63) Continuation of application No. 17/031,040, filed on Sep. 24, 2020, now Pat. No. 11,284,537, which is a
(Continued)

(30) Foreign Application Priority Data

Mar. 26, 2018 (CN) .......................... 201810254641.8

(51) Int. Cl.
*H05K 7/20* (2006.01)
*H04M 1/02* (2006.01)
*G06F 1/20* (2006.01)

(52) U.S. Cl.
CPC ........ *H05K 7/20336* (2013.01); *H04M 1/026* (2013.01); *H05K 7/205* (2013.01); *G06F 1/203* (2013.01); *H04M 1/02* (2013.01)

(58) Field of Classification Search
CPC .... H05K 7/20336; H05K 7/2099; G06F 1/20; G06F 1/203; H04M 1/026–0277
See application file for complete search history.

(56) References Cited

U.S. PATENT DOCUMENTS 6,205,025 B1 3/2001 Chen
8,559,173 B2 * 10/2013 Fujiwara .................. G06F 1/20
361/679.48
(Continued)

FOREIGN PATENT DOCUMENTS

CN 1755922 A 4/2006
CN 2845416 Y 12/2006
(Continued)

OTHER PUBLICATIONS

EPO "Search Opinion" for EP 19777721, dated Mar. 2021 (Year: 2021).*
(Continued)

*Primary Examiner* — Zachary Pape
(74) *Attorney, Agent, or Firm* — Conley Rose, P.C.

(57) ABSTRACT

A heat-conducting assembly includes a middle frame and a heat-conducting structure. The middle frame is plate-shaped, having a first side surface and a second side surface that are opposite to each other, and being provided with a first through hole through which the first side surface communicates with the second side surface. The heat-conducting structure includes a heat dissipation part and a conducting part. The heat dissipation part is fastened to the second side surface, and the conducting part extends into the first
(Continued)

through hole. The conducting part includes a conductor being connected to the heat dissipation part and a heat insulator which is fastened in the first through hole through the heat insulator, and is in contact with a heat source, which is close to one end that is of the first through hole and that is located on the first side surface.

23 Claims, 5 Drawing Sheets

Related U.S. Application Data continuation of application No. PCT/CN2019/077228, filed on Mar. 6, 2019.

(56) References Cited

U.S. PATENT DOCUMENTS

| | | | |
|---|---|---|---|
| 9,422,928 B2* | 8/2016 | Ventrapragada | ........ F04B 35/04 |
| 9,535,470 B2 | 1/2017 | Wu | |
| 10,019,046 B2 | 7/2018 | Shen | |
| 10,314,202 B2 | 6/2019 | Ahamed et al. | |
| 10,602,603 B2 | 3/2020 | Zhang et al. | |
| 11,284,537 B2* | 3/2022 | Sun | ................... H05K 7/20336 |
| 2010/0259897 A1 | 10/2010 | Min et al. | |
| 2011/0222237 A1 | 9/2011 | Fujiwara et al. | |
| 2021/0041926 A1 | 2/2021 | Park et al. | |

FOREIGN PATENT DOCUMENTS

| | | |
|---|---|---|
| CN | 101861075 A | 10/2010 |
| CN | 201904999 U | 7/2011 |
| CN | 104039115 A | 9/2014 |
| CN | 203912443 U | 10/2014 |
| CN | 204131906 U | 1/2015 |
| CN | 104902727 A | 9/2015 |
| CN | 204669802 U | 9/2015 |
| CN | 105188302 A | 12/2015 |
| CN | 105623619 A | 6/2016 |
| CN | 106304817 A | 1/2017 |
| CN | 106852067 A | 6/2017 |
| WO | 2016192069 A1 | 12/2016 |

OTHER PUBLICATIONS

EPO "Annex to the communication" for EP 19777721, dated Apr. 2023 (Year: 2023).*

* cited by examiner

HEAT-CONDUCTING ASSEMBLY AND TERMINAL

CROSS-REFERENCE TO RELATED APPLICATIONS

This is a continuation of U.S. patent application Ser. No. 17/031,040, filed on Sep. 24, 2020, which is a continuation of International Patent Application No. PCT/CN2019/077228 filed on Mar. 6, 2019, which claims priority to Chinese Patent Application No. 201810254641.8 filed on Mar. 26, 2018. All of the aforementioned patent applications are hereby incorporated by reference in their entireties.

TECHNICAL FIELD

This application relates to the field of electronic technologies, and in particular, to a heat-conducting assembly and a terminal.

BACKGROUND

With development of the times, mobile phones gradually become an indispensable part of people's lives.

A mobile phone includes a housing, a middle frame located in the housing, and a battery, a central processing unit (CPU), and another component that are disposed on the middle frame. When the mobile phone is used by a user, the CPU becomes a relatively large heat source in the mobile phone.

Therefore, how to conduct heat emitted by the heat source in the mobile phone becomes an urgent problem to be resolved.

SUMMARY

This application provides a heat-conducting assembly and a terminal, to resolve a problem of how to dissipate heat emitted by a heat source. The technical solutions are as follows.

According to a first aspect, a heat-conducting assembly is provided. The heat-conducting assembly includes a middle frame and a heat-conducting structure. The middle frame is plate-shaped, the middle frame has a first side surface and a second side surface that are opposite to each other, and the middle frame is provided with a first through hole through which the first side surface communicates with the second side surface. The heat-conducting structure includes a heat dissipation part and a conducting part. The heat dissipation part is fastened to the second side surface, and the conducting part extends into the first through hole. The conducting part includes a conductor and a heat insulator. The conductor is connected to the heat dissipation part, and the conductor is fastened in the first through hole through the heat insulator, and is in contact with a heat source. The heat source is close to one end that is of the first through hole and that is located on the first side surface.

The middle frame in the heat-conducting assembly is provided with the first through hole, and at least one part of the conducting part in the heat-conducting structure is fastened in the first through hole. In addition, the conducting part includes the conductor that can conduct heat with the heat source such that heat generated by the heat source can be conducted to the conductor, and then conducted by the conductor to the heat dissipation part for heat dissipation, to dissipate heat from the heat source. In addition, the conductor is fastened on the middle frame through the heat insulator, and the heat insulator can insulate from heat of the conductor. Because the heat source is in contact with the conductor, a contact area between the heat source and the middle frame is reduced, to reduce heat conducted from the heat source to the middle frame. This reduces a temperature of a part that is of the middle frame and that is close to the heat source, and reduces impact on a component that is on the middle frame and that is disposed close to the heat source.

Optionally, the heat insulator is disposed on an outer side of the conductor, and a region, on the outer side of the conductor, other than a region in contact with the heat insulator is disposed at a spacing from an inner wall of the first through hole. In this case, the conductor is not in direct contact with the middle frame. This greatly reduces heat conducted between the conductor and the middle frame, and further reduces a temperature of a part that is of the middle frame and that is close to the heat-conducting structure.

Optionally, a region that is of the middle frame and that is close to the heat dissipation part is further provided with at least one second through hole. Because there is the second through hole in the region that is of the middle frame and that is close to the heat dissipation part, a contact area between the heat dissipation part and the middle frame is reduced, to reduce heat conducted between the heat dissipation part and the middle frame.

Optionally, the region that is of the middle frame and that is close to the heat dissipation part includes at least one part of an orthographic projection region of the heat dissipation part on the middle frame.

Optionally, the heat dissipation part is strip-shaped, a length of the second through hole in a width direction of the heat dissipation part is a first length, and the first length is greater than the width of the heat dissipation part. In this case, the second through hole is relatively large such that a part of the heat dissipation part can be effectively isolated from the middle frame, to reduce heat conducted between the part of the heat dissipation part and the middle frame.

Optionally, the first through hole communicates with the second through hole. In this way, when the middle frame is manufactured, the first through hole and the second through hole can be simultaneously manufactured. Therefore, efficiency of manufacturing the middle frame is relatively high.

Optionally, the heat-conducting assembly further includes a first phase change structure. The first phase change structure is attached to an outer side of a part that is of the heat-conducting structure and that is not in contact with the middle frame and the heat source, and is configured to absorb heat of the heat-conducting structure, to reduce heating on a side of a terminal in which the heat-conducting assembly is located.

Optionally, the first through hole is a stepped hole. The stepped hole includes a small hole close to the second side surface and a large hole close to the first side surface, and a step is formed between the large hole and the small hole. The heat insulator is disposed on the step.

Optionally, the conductor includes a metal sheet and at least one part of an evaporator section in a heat pipe, one side of the metal sheet is in contact with the heat source, and the other side of the metal sheet is in contact with the at least one part of the evaporator section.

Optionally, the metal sheet is lapped on the heat insulator.

Optionally, the conductor includes at least one part of an evaporator section in a heat pipe, and the at least one part of the evaporator section is in contact with the heat source.

Optionally, the conductor further includes a plurality of metal rods. One end of each metal rod is fastened to the at least one part of the evaporator section, and the other end of the metal rod is lapped on the heat insulator.

Optionally, there are four metal rods. The four metal rods are divided into two groups of metal rods, and each group of metal rods includes two metal rods. The two groups of metal rods are respectively located on two sides of the at least one part of the evaporator section, and the heat source is located between the two metal rods.

Optionally, the heat-conducting structure is a heat pipe. The heat pipe includes an invalid section, an evaporator section, and a condenser section, and the evaporator section and the condenser section are sequentially connected. The heat dissipation part is the condenser section, the conducting part is the evaporator section, and the invalid section is fastened to the second side surface.

Optionally, the second side surface is in a rectangle shape, the heat source is close to one endpoint of any diagonal of the second side surface, and the heat dissipation part is close to the other endpoint of the any diagonal.

Optionally, the heat-conducting assembly further includes a second phase change structure, where the second phase change structure is located on a side that is of the heat source and that is away from the middle frame, and is configured to absorb heat of the heat source.

According to a second aspect, a terminal is provided. The terminal includes a heat source, housings, and the heat-conducting assembly according to the first aspect. The heat-conducting assembly includes a middle frame and a heat-conducting structure, and the heat-conducting structure is configured to dissipate heat from the heat source. The housings include a front housing and a rear housing, and the front housing and the rear housing are fastened on two sides of the middle frame. The heat source is located between the front housing and the middle frame, or the heat source is located between the rear housing and the middle frame.

Optionally, the heat-conducting assembly includes the middle frame, and further includes a second phase change structure. The second phase change structure is disposed on an inner side of the housing, and the heat source is located between the second phase change structure and the middle frame.

DESCRIPTION OF EMBODIMENTS

To make the objectives, technical solutions, and advantages of this application clearer, the following further describes the embodiments of this application in detail with reference to the accompanying drawings.

A terminal is a device commonly used in people's lives, for example, an electronic device such as a mobile phone or a tablet computer. The terminal includes a housing, a middle frame located in the housing, and a battery, a CPU, and another component that are disposed on the middle frame. In a process in which the terminal is used by a user, the CPU, the battery, or the other component may become a heat source in the mobile phone. The CPU is a heat source that emits a relatively large amount of heat. The embodiments of this application provide a heat-conducting assembly applied to the terminal. The heat-conducting assembly can dissipate heat from the heat source, to reduce an overall temperature of the terminal.

Figure 1:
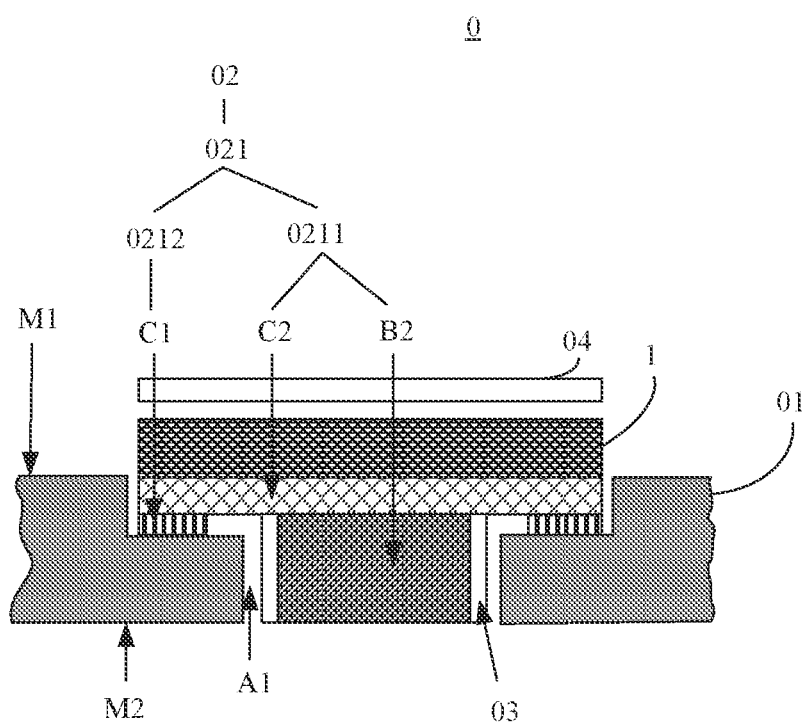
FIG. 1 is a schematic diagram of a structure of a heat-conducting assembly according to an embodiment of this application.
Figure 2:
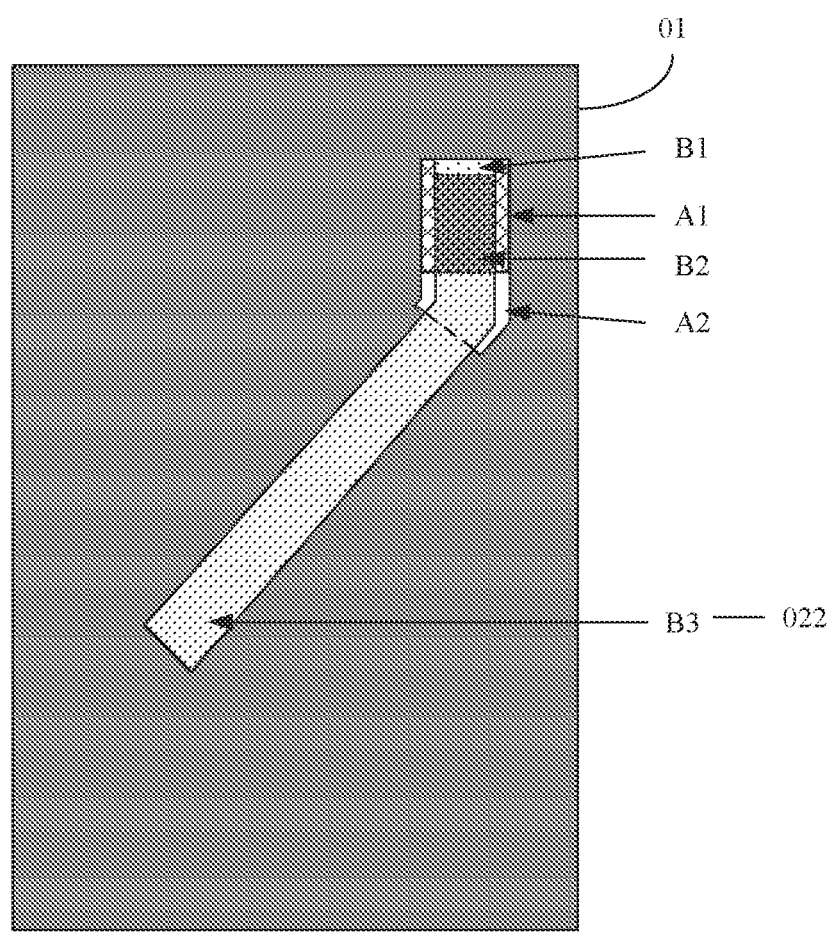
FIG. 2 is a bottom view of the heat-conducting assembly shown in FIG. 1.

FIG. 1 is a schematic diagram of a structure of a heat-conducting assembly according to an embodiment of this application. FIG. 2 is a bottom view of the heat-conducting assembly shown in FIG. 1. With reference to FIG. 1 and FIG. 2, the heat-conducting assembly 0 may include a middle frame 01 and a heat-conducting structure 02.

The middle frame 01 is plate-shaped, the middle frame 01 has a first side surface M1 and a second side surface M2 that are opposite to each other, and the middle frame 01 is provided with a first through hole A1 through which the first side surface M1 communicates with the second side surface M2.

The heat-conducting structure 02 includes a conducting part 021 and a heat dissipation part 022. The heat dissipation part 022 is fastened to the second side surface M2, and the conducting part 021 extends into the first through hole A1. The conducting part 021 may include a conductor 0211 and a heat insulator 0212. The conductor 0211 may be connected to the heat dissipation part 022. In addition, the conductor 0211 is fastened to an inner wall of the first through hole A1 through the heat insulator 0212, and is in contact with a heat source 1. The heat source 1 is close to one end that is of the first through hole A1 and that is located on the first side surface M1.

In conclusion, in the heat-conducting assembly provided in this embodiment of this application, the middle frame is provided with the first through hole, and at least one part of the conducting part in the heat-conducting structure is fastened in the first through hole. In addition, the conducting part includes the conductor that can conduct heat with the heat source and the heat dissipation part such that heat generated by the heat source can be conducted to the conductor, and then conducted by the conductor to the heat dissipation part for heat dissipation, to dissipate heat from the heat source.

In addition, the conductor is fastened on the middle frame through the heat insulator, and the heat insulator can insulate from heat of the conductor. Because the heat source is in contact with the conductor, a contact area between the heat source and the middle frame is reduced, to reduce heat conducted from the heat source to the middle frame. This reduces a temperature of a part that is of the middle frame and that is close to the heat source, and reduces impact on a component that is on the middle frame and that is disposed close to the heat source.

In addition, it should be noted that, to achieve a relatively good heat dissipation effect, the heat dissipation part needs to be disposed away from the heat source. For example, if the heat source is located in the upper part of the middle frame, the heat dissipation part may be disposed in the lower part of the middle frame. If the heat source is located in the top-right corner of the middle frame, the heat dissipation part may be disposed in the bottom-left corner of a terminal. As shown in FIG. 2, the second side surface of the middle frame 01 may be in a rectangle shape. The heat source 1 in FIG. 1 may be close to one endpoint (for example, close to the top-right vertex of the second side surface) of any diagonal (for example, the diagonal that connects the bottom-left vertex and the top-right vertex of the rectangle) of the second side surface. In this case, the heat dissipation part 022 is close to the other endpoint (for example, close to the bottom-right vertex of the second side surface) of the any diagonal.

Optionally, referring to FIG. 1, the heat insulator 0212 is disposed on an outer side of the conductor 0211, and a region, on the outer side of the conductor 0211, other than a region in contact with the heat insulator 0212 is disposed at a spacing from the inner wall of the first through hole A1. In this case, the conductor 0211 is not in direct contact with the middle frame 01. This greatly reduces heat conducted between the conductor 0211 and the middle frame 01, and further reduces a temperature of a part that is of the middle frame 01 and that is close to the heat-conducting structure 02. Optionally, the heat source 1 may not be in contact with the middle frame 01. This greatly reduces heat conducted between the heat source 1 and the middle frame 01, and further reduces the temperature of the part that is of the middle frame 01 and that is close to the heat source 1. In an embodiment, the heat source 1 may alternatively be in contact with a small part of the middle frame 01, and the conductor 0211 may alternatively be in contact with a small part of the middle frame 01. This is not limited in this embodiment of this application.

Further, referring to FIG. 2, a region that is of the middle frame 01 and that is close to the heat dissipation part 022 may be further provided with at least one second through hole A2. In this embodiment of this application, that the middle frame 01 is provided with one second through hole A2 is merely used as an example. In an embodiment, the middle frame 01 may alternatively be provided with a plurality of second through holes A2, and optionally, the plurality of second through holes A2 may be sequentially arranged in an extension direction of the heat dissipation part 022. This is not limited in this embodiment of this application. Because there is the second through hole A2 in the region that is of the middle frame 01 and that is close to the heat dissipation part 022, a contact area between the heat dissipation part 022 and the middle frame 01 is reduced, to reduce heat conducted between the heat dissipation part 022 and the middle frame 01. The region that is of the middle frame 01 and that is close to the heat dissipation part 022 may include at least one part of an orthographic projection region of the heat dissipation part 022 on the middle frame 01. For example, the region that is of the middle frame 01 and that is close to the heat dissipation part 022 may be the orthographic projection region of the heat dissipation part 022 on the middle frame 01. Alternatively, the region that is of the middle frame 01 and that is close to the heat dissipation part 022 may include the orthographic projection region of the heat dissipation part 022 on the middle frame 01 and a neighboring region. Optionally, the heat dissipation part 022 may be strip-shaped, a length of the second through hole A2 in a width direction of the heat dissipation part 022 is a first length, and the first length may be greater than the width of the heat dissipation part 022. Optionally, a minimum edge distance between an orthographic projection of the heat source 1 on the first side surface M1 in FIG. 1 and the second through hole A2 in FIG. 2 may be greater than or equal to 5 millimeters.

Optionally, still referring to FIG. 2, the first through hole A1 communicates with the second through hole A2. In this way, when the middle frame 01 is manufactured, the first through hole A1 and the second through hole A2 can be simultaneously manufactured. Therefore, efficiency of manufacturing the middle frame 01 is relatively high. In an embodiment, the first through hole A1 may alternatively not communicate with the second through hole A2. This is not limited in this embodiment of this application.

Optionally, still referring to FIG. 1, the heat-conducting assembly 0 may further include a first phase change structure 03 and a second phase change structure 04. It should be noted that the first phase change structure 03 in FIG. 1 is not shown in FIG. 2. The first phase change structure 03 is attached to an outer side of a part that is of the heat-conducting structure 02 and that is not in contact with the middle frame 01 and the heat source 1, and is configured to absorb heat of the heat-conducting structure 02. The second phase change structure 04 is located on a side that is of the heat source 1 and that is away from the middle frame 01. In other words, the heat source 1 is located between the second phase change structure 04 and the middle frame 01. The second phase change structure 04 is configured to absorb heat of the heat source 1.

It should be noted that both materials of the first phase change structure 03 and the second phase change structure 04 are phase-change materials (PCMs). A physical property of the PCM can vary with an ambient temperature, and the PCM absorbs heat in an environment during change of the physical property. Optionally, the PCM may be any one of an inorganic material, an organic material, and a hybrid PCM, and phase change latent heat of the PCM is greater than or equal to 120 Joules per gram (J/g). Mass of the PCM in each of the first phase change structure and the second phase change structure is related to heat that needs to be absorbed by the phase change structure. For example, if the material of the phase change structure is a PCM whose enthalpy is 120 J/g, when the phase change structure needs to absorb heat of 1 watt within 1 minute, mass of the PCM that needs to be used is 1×1×60/120=0.5 g, and the phase change structure may be a PCM layer whose thickness is greater than or equal to 0.1 millimeter.

Quantities of first phase change structures 03 and second phase change structures 04 and sizes of the first phase change structure 03 and the second phase change structure 04 are not limited in this embodiment of this application. For example, still referring to FIG. 1, the heat-conducting assembly 0 may include two first phase change structures 03 and one second phase change structure 04. In addition, the two first phase change structures 03 are respectively located on two sides of the heat-conducting structure 02 (for example, located on two sides of a part that is of the conductor in the heat-conducting structure 02 and that is not in contact with the middle frame 01 and the heat source 1). The two first phase change structures 03 are both configured to absorb the heat of the heat-conducting structure 02, to reduce heating on a side of the terminal in which the heat-conducting structure 02 is located. The second phase change structure 04 may be disposed on an inner side of a housing of the terminal, and the heat source 1 is located between the middle frame 01 and the second phase change structure 04 (in this case, the heat source 1 may be located on an inner side of a rear housing in the housing). The second phase change structure 04 is configured to reduce heating of the housing (especially the rear housing).

The heat-conducting structure in this embodiment of this application may have a plurality of possible implementations. The following describes several possible implementations using examples.

According to a first aspect, a first possible implementation of the heat-conducting structure may be shown in FIG. 1 and FIG. 2.

Referring to FIG. 1, the first through hole A1 is a stepped hole, where the stepped hole includes a small hole close to the second side surface M2 and a large hole close to the first side surface M1, a step is formed between the large hole and the small hole, and the heat insulator 0212 may be disposed on the step. For example, the heat insulator 0212 may include two groups of heat insulation blocks C1 disposed on the step, and the conductor 0211 may include a metal sheet C2 and at least one part of an evaporator section B2 in a heat pipe (that the conductor includes the entire evaporator section B2 in the heat pipe is used as an example in this embodiment of this application). The metal sheet C2 may be lapped on the two groups of heat insulation blocks C1, and the at least one part of the evaporator section B2 may be located between the two groups of heat insulation blocks C1. One side of the metal sheet C2 is in contact with the heat source 1, and the other side of the metal sheet C2 is in contact with the at least one part of the evaporator section B2. Referring to FIG. 2, the heat dissipation part 022 may include a condenser section B3 in the heat pipe. Optionally, the heat-conducting structure may further include an invalid section B1 in the heat pipe.

It should be noted that the heat pipe may include a pipe shell, a wick, and liquid. The wick is located in the pipe shell and absorbs liquid. FIG. 2 is a bottom view of the heat-conducting assembly shown in FIG. 1. As shown in FIG. 2, the heat pipe may be sequentially divided into the invalid section B1, the evaporator section B2, and the condenser section B3. When the heat source heats the evaporator section B2, liquid in the evaporator section B2 evaporates into vapor, and the vapor moves toward the condenser section B3. Because the condenser section B3 is disposed away from the heat source, a temperature of the condenser section B3 is relatively low, the vapor condenses in the condenser section B3, and heat brought by the vapor is conducted in the condenser section B3 out of the heat pipe.

Further, the heat source 1 in FIG. 1 may be in contact with the metal sheet C2 through a thermal interface material (TIM), and the at least one part of the evaporator section B2 may also be in contact with the metal sheet C2 through the TIM. The TIM is not shown in FIG. 1. A material of the metal sheet C2 may be copper, copper alloy, stainless steel, or the like. An opening of the first through hole A1 may be in any shape, for example, a square, a rectangle, or a circle, and a width of the step in the stepped hole may be greater than or equal to 2 millimeters. The heat insulation block C1 in the heat insulator may be made of heat insulation glue whose thickness is greater than or equal to 0.05 millimeter, and a thermal conductivity of the heat insulation glue may be less than or equal to 0.2 Watts per meter Kelvin (W/(m·K)). The heat pipe (including the invalid section B1, the evaporator section B2, and the condenser section B3) in FIG. 2 may be attached to the second side surface of the middle frame 01 through glue (for example, heat insulation glue, not shown in FIG. 2).

Figure 3:
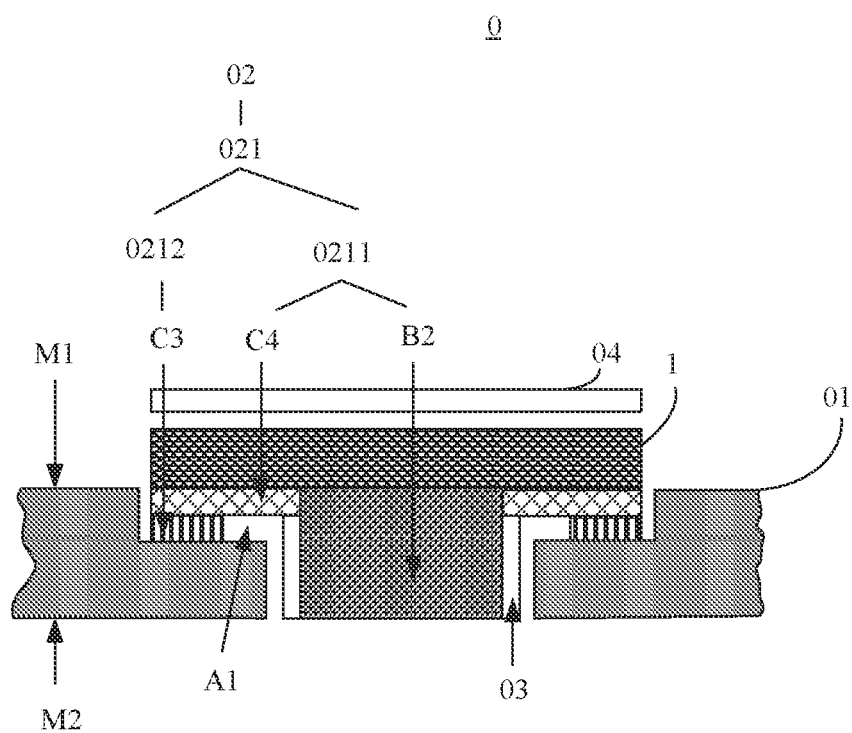
FIG. 3 is a schematic diagram of a structure of another heat-conducting assembly according to an embodiment of this application.
Figure 4:
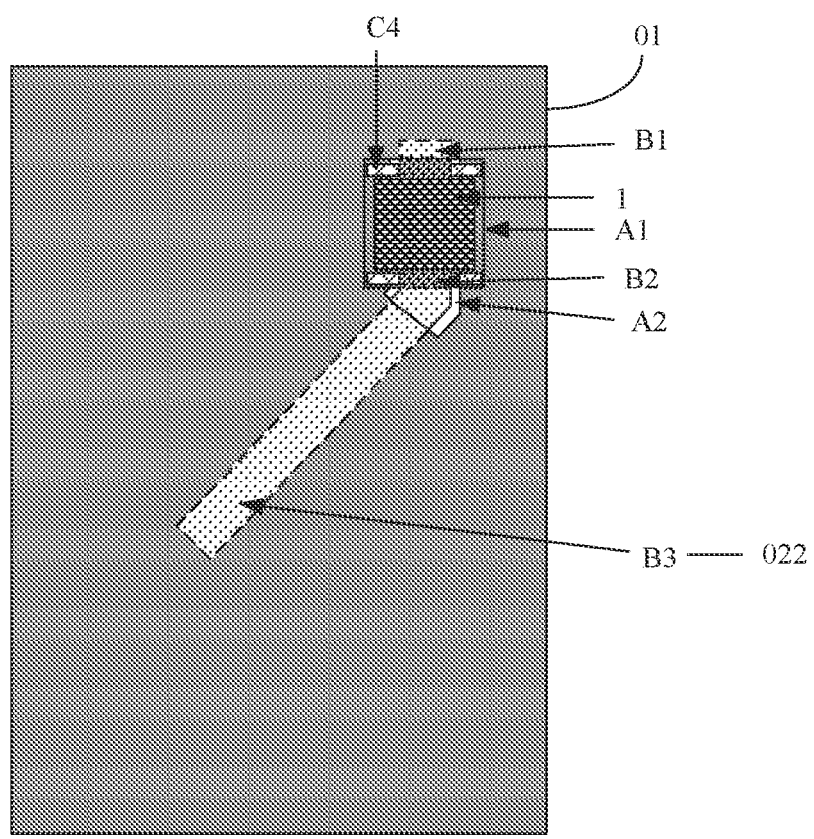
FIG. 4 is a top view of a partial structure of the heat-conducting assembly shown in FIG. 3.

According to a second aspect, a second possible implementation of the heat-conducting structure may be shown in FIG. 3 and FIG. 4.

FIG. 3 is a schematic diagram of a structure of another heat-conducting assembly according to an embodiment of this application. FIG. 4 is a top view of a partial structure of the heat-conducting assembly shown in FIG. 3 (the second phase change structure 04 in FIG. 3 is not shown in FIG. 4). Referring to FIG. 3, the first through hole A1 is a stepped hole, where the stepped hole includes a small hole close to the second side surface M2 and a large hole close to the first side surface M1, a step is formed between the large hole and the small hole, and the heat insulator 0212 may be disposed on the step. The heat insulator 0212 may include a plurality of heat insulation blocks C3, and the conductor 0211 includes at least one part of an evaporator section B2 in a heat pipe and a plurality of metal rods C4. Referring to FIG. 4, the heat dissipation part 022 may include a condenser section B3 in the heat pipe. Optionally, the heat-conducting structure may further include an invalid section B1 in the heat pipe.

Still referring to FIG. 3, one end of each metal rod C4 is fastened to the at least one part of the evaporator section B2, and the other end of the metal rod C4 is lapped on the heat insulator 0212. For example, the plurality of heat insulation blocks C3 may one-to-one correspond to the plurality of metal rods C4, and the other end of the metal rod C4 is lapped on a corresponding heat insulation block C3. A material of the metal rod C4 may be copper, copper alloy, stainless steel, or the like. As shown in FIG. 4, there may be four metal rods C4, the four metal rods C4 are divided into two groups of metal rods C4, and each group of metal rods C4 includes two metal rods C4. The two groups of metal rods C4 may be respectively located on two sides of the at least one part of the evaporator section B2. As shown in FIG. 4, the heat source 1 may be located between two metal rods C4 in each group of metal rods C4.

The heat source 1 in FIG. 3 may be connected to the at least one part of the evaporator section B2 through a TIM. The heat insulation block C3 in the heat insulator 0212 may be made of heat insulation glue whose thickness is greater than or equal to 0.05 millimeter, and a thermal conductivity of the heat insulation glue may be less than or equal to 0.2 W/(m·K). The heat pipe (including the invalid section B1, the evaporator section B2, and the condenser section B3) in FIG. 4 may be attached to the second side surface of the middle frame 01 through glue (for example, heat insulation glue, not shown in FIG. 4).

Figure 5:
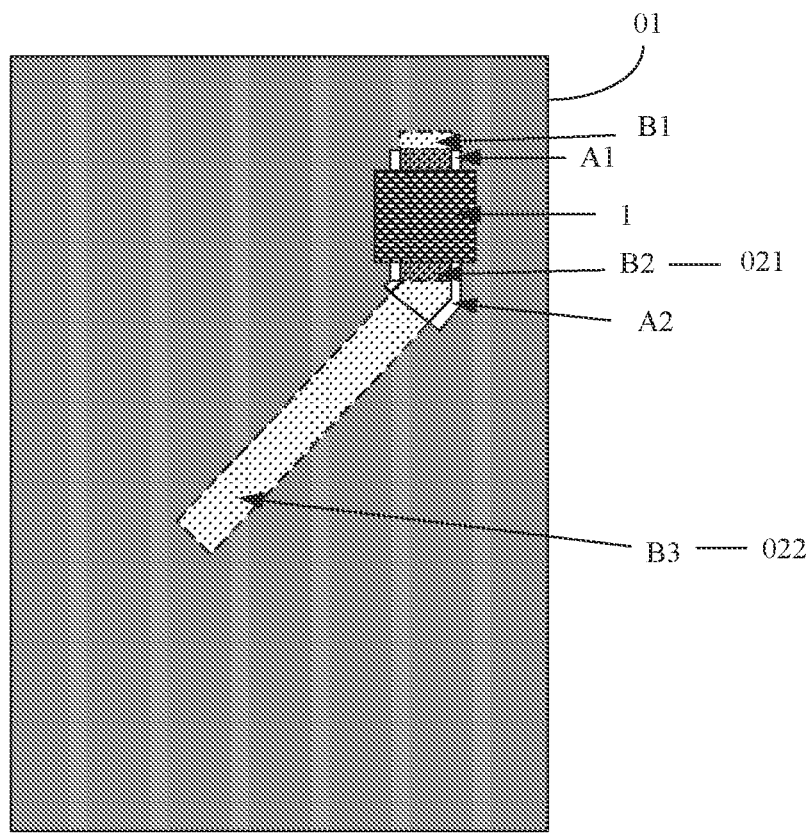
FIG. 5 is a schematic diagram of a structure of still another heat-conducting assembly according to an embodiment of this application.

According to a third aspect, a third possible implementation of the heat-conducting structure may be shown in FIG. 5.

FIG. 5 is a schematic diagram of a structure of still another heat-conducting assembly according to an embodiment of this application. As shown in FIG. 5, the conducting part 021 includes at least one part of an evaporator section B2 in a heat pipe, and the heat dissipation part 022 may include a condenser section B3 in the heat pipe. Optionally, the heat-conducting structure may further include an invalid section B1 in the heat pipe.

In the second possible implementation and the third possible implementation of the heat-conducting structure, the heat source is in direct contact with the at least one part of the evaporator section in the heat pipe. Therefore, the two possible implementations may be applicable to a case in which the depth of the first through hole is relatively small, that is, applicable to a relatively thin middle frame.

Optionally, in the heat-conducting assembly shown in FIG. 1 to FIG. 5, a first sunken groove (which is not shown in FIG. 1 to FIG. 5, and may be located in a location of the invalid section of the heat pipe in the middle frame) and a second sunken groove (which is not shown in FIG. 1 to FIG. 5, and may be located in a location of the heat dissipation part in the middle frame) may be further disposed in the middle frame 01. The first sunken groove, the first through hole A1, the second through hole A2, and the second sunken groove may be sequentially arranged and communicate with each other. One end that is of the heat pipe and in which the invalid section is located is laid in the first sunken groove, and one end that is of the heat pipe and in which the condenser section is located is laid in the second sunken groove. The depth of each of the first sunken groove and the second sunken groove may be greater than or equal to 0.15 millimeter.

In conclusion, in the heat-conducting assembly provided in the embodiments of this application, the middle frame is provided with the first through hole, and at least one part of the conducting part in the heat-conducting structure is fastened in the first through hole. In addition, the conducting part includes the conductor that can conduct heat with the heat source such that heat generated by the heat source can be conducted to the conductor, and then conducted by the conductor to the heat dissipation part for heat dissipation, to dissipate heat from the heat source.

In addition, the conductor is fastened on the middle frame through the heat insulator, and the heat insulator can insulate from heat of the conductor. Because the heat source is in contact with the conductor, a contact area between the heat source and the middle frame is reduced, to reduce heat conducted from the heat source to the middle frame. This reduces a temperature of a part that is of the middle frame and that is close to the heat source, and reduces impact on a component that is on the middle frame and that is disposed close to the heat source.

In addition, because the temperature of the middle frame is reduced, a temperature of a side of the terminal in which the middle frame is located can be reduced. In addition, the second through hole can reduce heat conducted between the heat-conducting structure and the middle frame, and further reduce the impact on the component that is on the middle frame and that is disposed close to the heat source. Under an effect of the first phase change structure and the second phase change structure, if an amount of heat emitted by the heat source is relatively large, the first phase change structure and the second phase change structure can absorb the heat, to assist the heat-conducting structure in dissipating the heat, and reduce temperatures of a rear surface and a side surface of the terminal. It is verified that the heat-conducting assembly provided in the embodiments of this application can reduce a temperature of the heat source by 3-5 degrees Celsius (° C.), and reduce each of the temperature of the side of the terminal and a temperature of a housing close to the heat source by 2-3° C.

It should be noted that in the embodiments of this application, both the conductor and the heat dissipation part may be implemented by the heat pipe. For example, the heat pipe may be divided into two sections that are sequentially arranged, and the two sections that are sequentially arranged may be the evaporator section and the condenser section that are sequentially arranged. Alternatively, the heat pipes may be divided into three sections that are sequentially arranged, and the three sections that are sequentially arranged may be the invalid section, the evaporator section, and the condenser section that are sequentially arranged. The invalid section, the evaporator section, and the condenser section are names of sections in the heat pipe. The evaporator section of the heat pipe may be used to implement the conductor, and the condenser section of the heat pipe may be used to implement the heat dissipation part. In addition, the accompanying drawings (for example, FIG. 2, FIG. 4, and FIG. 5) provided in the embodiments of this application merely show examples of a location relationship among the invalid section, the evaporator section, and the condenser section that are obtained by dividing the heat pipe. Optionally, the location relationship among the invalid section, the evaporator section, and the condenser section that are obtained by dividing the heat pipe may alternatively be different from the location relationship shown in the accompanying drawings provided in the embodiments of this application.

Figure 6:
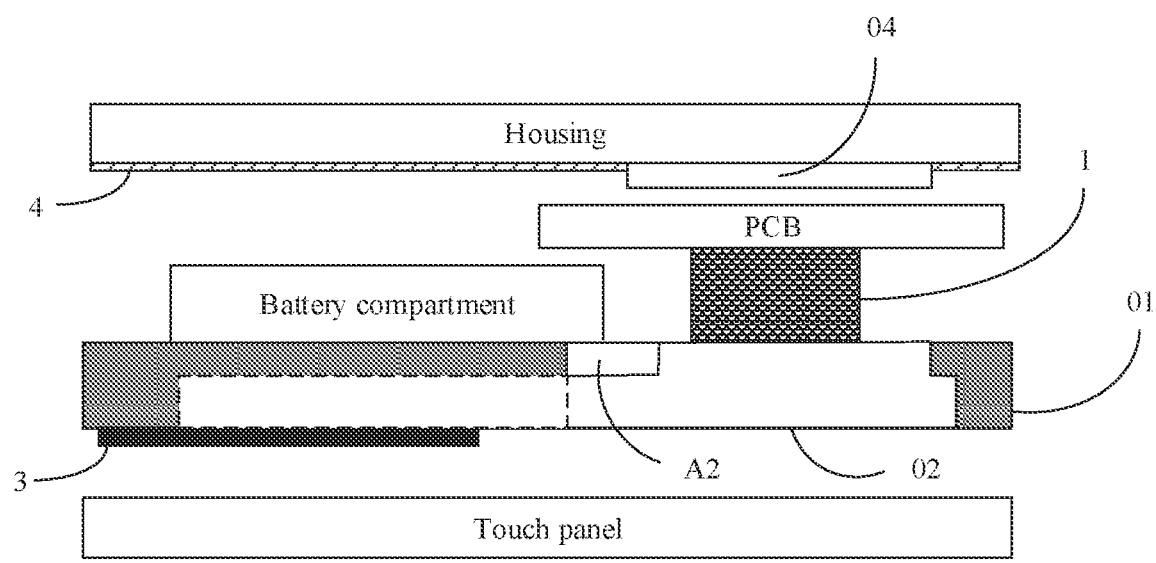
FIG. 6 is a schematic diagram of a structure of a terminal according to an embodiment of this application.

FIG. 6 is a schematic diagram of a structure of a terminal according to an embodiment of this application. As shown in FIG. 6, the terminal may include a heat source 1, housings, and a heat-conducting assembly. The heat-conducting assembly may be the heat-conducting assembly in any one of FIG. 1 to FIG. 5. The heat-conducting assembly is configured to dissipate heat emitted by the heat source.

The housings may include a front housing and a rear housing (FIG. 6 shows only the rear housing), and the front housing and the rear housing are fastened on two sides of a middle frame 01. The heat source 1 is located between the front housing and the middle frame 01, or the heat source 1 is located between the rear housing and the middle frame 01 (FIG. 6 shows an example in which the heat source 1 is located between the rear housing and the middle frame 01).

Optionally, the terminal 6 may be a mobile phone, a tablet computer, or another type of terminal. The terminal 6 may further include a touch panel, and a battery compartment may be further disposed on the middle frame 01 in the heat-conducting assembly. It should be noted that FIG. 6 shows only a part that is of the housing (also referred to as the rear housing) and that is opposite to the touch panel, and does not show a part that is of the housing and that is connected to the middle frame.

The heat source 1 may be a CPU, the CPU is disposed on a printed circuit board (PCB), and the heat source 1 may be located between the PCB and the middle frame 01. Optionally, the heat source 1 may alternatively be fastened on the middle frame 01. For example, the PCB may be fastened on the middle frame through a fastener (for example, a screw) (a part that is of the PCB and that is connected to the middle frame is not shown in FIG. 6), and the CPU is disposed on the PCB, which is equivalent to that the CPU is fastened on the middle frame through the PCB. It should be noted that, in this embodiment of this application, an example in which the heat source 1 is the CPU is used. Optionally, the heat source may alternatively be another structure in the terminal. For example, the heat source includes the CPU and the PCB. This is not limited in this embodiment of this application.

Optionally, a second phase change structure 04 in the heat-conducting assembly may be disposed on an inner side of the housing, and the heat source 1 may be located between the second phase change structure 04 and the middle frame 01. For example, the second phase change structure 04 may be disposed on an inner surface of the rear housing. Alternatively, the second phase change structure 04 may be disposed on a surface that is of the PCB and that is away from the CPU. In this case, the second phase change structure 04 is located between the housing and the PCB.

In addition, a condenser section of a heat pipe may be further covered with a heat-conducting material 3 (for example, graphite or metal) having a relatively high thermal conductivity, and an explosion-proof film 4 may be further attached to the inner side of the housing.

Optionally, the terminal may further include at least one network interface, a memory, and at least one bus (not shown in FIG. 6). The bus is configured to implement connection and communication between the CPU, the network interface, and the memory. The memory and the network interface are connected to the CPU through the bus. The CPU may further execute an executable module stored in the memory, for example, a computer program. The memory may include a high-speed random-access memory (RAM), and may further include a non-volatile memory, for example, at least one magnetic disk memory. A communication connection between the terminal and at least one other device is implemented through the at least one network interface (which is wired or wireless). In some implementations, the memory stores a program. The program can be executed by the CPU.

The invention claimed is:

1. A heat-conducting assembly, comprising:
a middle frame that is plate-shaped and comprises:
a first side surface;
a second side surface opposite to the first side surface; and
a first through hole through which the first side surface is coupled to the second side surface; and
a heat-conducting structure comprising:
a heat dissipation part; and
a conducting part extending into the first through hole and comprising:
a heat insulator;
a conductor connected to the heat dissipation part, fastened in the first through hole via the heat insulator, and configured to contact a heat source that is adjacent to one end of the first through hole and on the first side surface,
wherein the heat-conducting assembly further comprises a first phase change structure attached to a part of an outer side that is of the heat-conducting structure and that is not in contact with the middle frame and the heat source, and wherein the first phase change structure is configured to absorb heat of the heat-conducting structure.

2. The heat-conducting assembly of claim 1, wherein the heat insulator is disposed on a first region of an outer side of the conductor, and wherein a second region on the outer side is spaced apart from an inner wall of the first through hole.

3. The heat-conducting assembly of claim 1, wherein a third region of the middle frame that is adjacent to the heat dissipation part comprises a second through hole.

4. The heat-conducting assembly of claim 3, wherein the third region further comprises a part of an orthographic projection region of the heat dissipation part.

5. The heat-conducting assembly of claim 3, wherein the heat dissipation part is strip-shaped, and wherein a first length of the second through hole in a width direction of the heat dissipation part is greater than a width of the heat dissipation part.

6. The heat-conducting assembly of claim 3, wherein the first through hole is coupled to the second through hole.

7. The heat-conducting assembly of claim 1, wherein the first through hole is a stepped hole.

8. The heat-conducting assembly of claim 1, wherein the first through hole is a stepped hole comprising:
a first hole adjacent to the first side surface;
a second hole adjacent to the second side surface; and
a step is located between the first hole and the second hole, and
wherein the heat insulator is disposed on the step.

9. The heat-conducting assembly of claim 8, wherein the conductor comprises:
a metal sheet comprising a first side and a second side that is configured to contact the heat source; and
a part of an evaporator section in a heat pipe, wherein the first side is in contact with the part of the evaporator section.

10. The heat-conducting assembly of claim 9, wherein the metal sheet touches the heat insulator.

11. The heat-conducting assembly of claim 8, wherein the conductor comprises a part of an evaporator section in a heat pipe, and wherein the part of the evaporator section is configured to contact the heat source.

12. The heat-conducting assembly of claim 11, wherein the conductor further comprises a plurality of metal rods, wherein one end of each of the metal rods is fastened to the part of the evaporator section, and wherein another end of each of the metal rods touches the heat insulator.

13. The heat-conducting assembly of claim 12, wherein the metal rods comprise four metal rods that are divided into two groups of metal rods, wherein each of the two groups comprises two metal rods, wherein the two groups are located on two sides of the part of the evaporator section, and wherein the heat source is located between the two metal rods.

14. The heat-conducting assembly of claim 9, wherein the heat-conducting structure is the heat pipe, and wherein the heat pipe comprises:
an invalid section fastened to the second side surface and lacking a wick structure;
an evaporator section coupled to the invalid section, wherein the conducting part is the evaporator section; and
a condenser section coupled to the evaporator section, wherein the heat dissipation part is the condenser section.

15. The heat-conducting assembly of claim 1, wherein the second side surface is in a rectangle shape, wherein the heat source is configured to be disposed adjacent to one endpoint of a diagonal of the second side surface, and wherein the heat dissipation part is located adjacent to another endpoint of the diagonal.

16. A terminal, comprising:
a heat source;
a heat-conducting assembly comprising:
a middle frame that is plate-shaped and comprises:
a first side surface;
a second side surface opposite to the first side surface; and
a first through hole through which the first side surface is coupled to the second side surface, and
wherein the heat source is adjacent to one end of the first through hole and is located on the first side surface; and
a heat-conducting structure coupled to the middle frame, configured to dissipate heat from the heat source, and comprising:
a heat dissipation part; and
a conducting part extending into the first through hole and comprising:
a heat insulator; and
a conductor connected to the heat dissipation part, fastened in the first through hole via the heat insulator, and configured to contact the heat source; and
a plurality of housings comprising:
a front housing fastened to a first side of the middle frame; and
a rear housing fastened to a second side of the middle frame,
wherein the heat source is located between the front housing and the middle frame or between the rear housing and the middle frame.

17. The terminal of claim 16, wherein the heat insulator is disposed on a first region of an outer side of the conductor, and wherein a second region on the outer side is spaced apart from an inner wall of the first through hole.

18. The terminal of claim 16, wherein a third region of the middle frame that is adjacent to the heat dissipation part further comprises a second through hole, wherein the heat dissipation part is strip-shaped, and wherein a first length of the second through hole in a width direction of the heat dissipation part is greater than a width of the heat dissipation part.

19. The terminal of claim 16, wherein the heat-conducting assembly further comprises a first phase change structure attached to a part of an outer side that is of the heat-conducting structure and that is not in contact with the middle frame and the heat source, and wherein the first phase change structure is configured to absorb heat of the heat-conducting structure.

20. The terminal of claim 16, wherein the first through hole is a stepped hole comprising:
a first hole adjacent to the first side surface;
a second hole adjacent to the second side surface; and
a step located between the first hole and the second hole, and
wherein the heat insulator is disposed on the step.

21. The terminal of claim 20, wherein the conductor comprises:
a metal sheet comprising a first side of the metal sheet and a second side of the metal sheet that is in contact with the heat source; and
a part of an evaporator section in a heat pipe, wherein the first side of the metal sheet is in contact with the part of the evaporator section, and wherein the metal sheet is lapped on the heat insulator.

22. The terminal of claim 20, wherein the conductor comprises a part of an evaporator section in a heat pipe, wherein the part of the evaporator section is in contact with the heat source, wherein the conductor further comprises a plurality of metal rods, wherein one end of each of the metal rods is fastened to the part of the evaporator section, and wherein another end of each of the metal rods is lapped on the heat insulator.

23. The terminal of claim 16, wherein the heat-conducting assembly further comprises a second phase change structure disposed on an inner side of the rear housing, and wherein the heat source is located between the second phase change structure and the middle frame.

* * * * *